US010121737B2

(12) United States Patent
Gottwald et al.

(10) Patent No.: US 10,121,737 B2
(45) Date of Patent: Nov. 6, 2018

(54) PRINTED CIRCUIT BOARD ELEMENT AND METHOD FOR PRODUCING A PRINTED CIRCUIT BOARD ELEMENT

(71) Applicant: Schweizer Electronic AG, Schramberg (DE)

(72) Inventors: Thomas Gottwald, Dunningen (DE); Christian Roessle, St. Georgen (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 0 days.

(21) Appl. No.: 15/634,824

(22) Filed: Jun. 27, 2017

(65) Prior Publication Data

US 2018/0005935 A1    Jan. 4, 2018

(30) Foreign Application Priority Data

Jun. 30, 2016  (DE) .................. 10 2016 211 968

(51) Int. Cl.
*H01L 23/498* (2006.01)
*H01L 21/48* (2006.01)
*H01L 21/56* (2006.01)
*H01L 23/31* (2006.01)
*H01L 23/495* (2006.01)
(Continued)

(52) U.S. Cl.
CPC ...... *H01L 23/49861* (2013.01); *H01L 21/486* (2013.01); *H01L 21/56* (2013.01); *H01L 23/3121* (2013.01); *H01L 23/49562* (2013.01); *H01L 23/49575* (2013.01); *H01L 23/49827* (2013.01); *H01L 23/58* (2013.01); *H01L 24/32* (2013.01); *H01L 24/33* (2013.01); *H01L 25/074* (2013.01); *H01L 25/50* (2013.01); *H01L 23/3675* (2013.01); *H01L 24/83* (2013.01); *H01L 2224/32245* (2013.01); *H01L 2224/33051* (2013.01); *H01L 2924/13055* (2013.01); *H01L 2924/13091* (2013.01)

(58) Field of Classification Search
CPC ................ H01L 23/49861; H01L 23/49575
USPC ........................................ 257/676; 15/676
See application file for complete search history.

(56) References Cited

U.S. PATENT DOCUMENTS

2009/0189291 A1   7/2009  Landan et al.
2016/0172279 A1   6/2016  Cho

FOREIGN PATENT DOCUMENTS

WO    WO 2014/139674    9/2014

OTHER PUBLICATIONS

Office Action in the priority application DE 10 2016 211 968.0, dated Dec. 8, 2016.

*Primary Examiner* — Anthony Ho

(57) ABSTRACT

The invention relates to an electronic component, namely a printed circuit board element comprising a first semiconductor component (14) which is arranged on an upper side of an electrically conductive intermediate plate (16) such that a connector pad (18) of the semiconductor component (14) is electrically contacted with the intermediate plate (16) and comprising a second semiconductor component (15) which is arranged on a lower side of the intermediate plate (16). The second semiconductor component (15) comprises a first connector pad (17) and a second connector pad (19), wherein both connector pads (17, 19) are aligned in the direction of the intermediate plate (16) and wherein the first connector pad (17) is contacted with the intermediate plate (16), and wherein the second connector pad (19) is not contacted with the intermediate plate (16). Moreover, the invention relates to a method for producing such a printed circuit board element.

24 Claims, 10 Drawing Sheets

(51) Int. Cl.
*H01L 23/58* (2006.01)
*H01L 23/00* (2006.01)
*H01L 25/07* (2006.01)
*H01L 25/00* (2006.01)
*H01L 23/367* (2006.01)

PRINTED CIRCUIT BOARD ELEMENT AND METHOD FOR PRODUCING A PRINTED CIRCUIT BOARD ELEMENT

FIELD OF THE INVENTION

The invention relates to a printed circuit board element and a method for producing a printed circuit board element.

BACKGROUND OF THE INVENTION

If a plurality of semiconductor components are interconnected with one another in an electronic component such as a printed circuit board element (e.g. in the form of a so-called electrical half-bridge arrangement), an arrangement of the semiconductor components in which the connector pads are easily accessible is usually selected. By way of example, this is the case if the semiconductor components are arranged next to one another in a plane; see WO 2014/139674 A1.

SUMMARY OF THE INVENTION

The invention is based on the object of presenting a compact printed circuit board element and a method for producing a compact printed circuit board element. Departing from the aforementioned prior art, the object is achieved by a printed circuit board element and by a method having the features as disclosed herein. Advantageous embodiments are specified herein.

In the electronic component according to the invention, namely a printed circuit board element, a first semiconductor component is arranged on an upper side of an electrically conductive intermediate plate such that a connector pad of the semiconductor component has a whole-area electrical contact with the intermediate plate. A second semiconductor component is arranged on a lower side of the intermediate plate. The second semiconductor component comprises a first connector pad and a second connector pad, which are both aligned in the direction of the intermediate plate. The first connector pad is contacted with the intermediate plate; the second connector pad is not contacted with the intermediate plate. The intermediate plate forms a phase tap of the printed circuit board element.

In the method according to the invention for producing a printed circuit board element, a first semiconductor component is arranged on an upper side of an electrically conductive intermediate plate such that a connector pad of the semiconductor component has a whole-area electrical contact with the intermediate plate. A second semiconductor component is arranged on a lower side of the intermediate plate. The second semiconductor component comprises a first connector pad and a second connector pad, wherein the two connector pads are aligned in the direction of the intermediate plate. The first connector pad is contacted with the intermediate plate. The second connector pad is not contacted with the intermediate plate. The intermediate plate is designed as a phase tap of the printed circuit board element.

The specification of top/bottom or upper side/lower side relates to the illustration that is selected in the Figures and should not be construed as a restriction in view of a specific alignment of the printed circuit board element. For reasons of clarity, the first semiconductor component is referred to as upper component and the second semiconductor component is referred to as lower component below. This should not be construed as a restriction either.

An electrically conductive connection between the connector pad of the first semiconductor component and the first connector pad of the second semiconductor component is established by way of the intermediate plate. By virtue of the semiconductor components being contacted with different sides of the intermediate plate, the option of a space-saving arrangement of the semiconductor components, which extends over various planes, arises. A short circuit between the two connector pads of the second semiconductor component, which are both aligned in the direction of the intermediate plate, is avoided by virtue of the second connector pad not being contacted with the intermediate plate.

High currents are discharged via the intermediate plate that is designed as a phase tap. It is advantageous for the purposes of introducing the high currents into the intermediate plate if the connector pad of the first semiconductor component has a whole-area electrical contact with the intermediate plate. In contrast to electronic components in which the connector pad does not have a whole-area electrical contact with the intermediate plate (US 2016/0172279 A1), the printed circuit board element according to the invention is designed for the introduction of high currents into the intermediate plate. Electronic components in which the intermediate plate does not serve as a phase tap (US 2009/0189291 A1) serve for a different purpose and are remote prior art.

The first semiconductor component and/or the second semiconductor component may have the features presented below. On its upper side, the semiconductor component may comprise a first connector pad and a second connector pad. The first connector pad can be designed as a source; the second connector pad can be designed as a gate. On its lower side, the semiconductor component may comprise a third connector pad. The third connector pad may be embodied as a drain. The third connector pad may extend over a large area of the upper side of the semiconductor component. By way of example, the third connector pad may extend over at least 70%, preferably at least 80%, more preferably at least 90%, of the area spanned by the semiconductor component. The third connector pad may form a closed area without internal interruptions.

The first connector pad may extend over a large area of the lower side of the semiconductor component. The first connector pad may comprise an internal recess, within which the second connector pad is arranged. The area assumed by the first connector pad may be greater than the area assumed by the second connector pad by at least a factor of 2, preferably by at least a factor of 5, more preferably by at least a factor of 10. The area assumed by the second connector pad may extend over at least 70%, preferably at least 80%, more preferably at least 90%, of the area spanned by the semiconductor component.

In accordance with the invention, the third connector pad of the first semiconductor component, which may, in particular, be the drain contact, has a whole-area electrical contact with the intermediate plate. In an embodiment of the invention, the first connector pad of the second semiconductor component, which may, in particular, be the source contact, also has a whole-area electrical contact with the intermediate plate.

The first connector pad and the second connector pad of the second semiconductor component may be arranged in a common plane that is parallel to the intermediate plate. The intermediate plate may comprise a recess in order to avoid an electrical contact between the intermediate plate and the second connector pad of the second semiconductor component. The recess may be filled with an insulating material.

The recess may have the form of a through hole which extends through the intermediate plate. Then, it is possible to contact the second connector pad from the upper side of the intermediate plate. To this end, the printed circuit board element may comprise an electrical conductor which extends through the through hole and which is contacted with the second connector pad. An (intermediate) space or interstice between the conductor and the intermediate plate may be filled with an electrically insulating material, for example an insulating resin.

In relation to the plane of the intermediate plate, the conductor may form a ring. The interior of the ring may be filled with an insulating material. The ring has an end face that points to the upper side of the intermediate plate and an end face that points to the lower side of the intermediate plate. The ring may be sealed at one or both end faces with a layer made of conductive material. Just like the ring, the material layer should be electrically insulated from the intermediate plate. The material layer may be arranged in the same plane as the surface of the intermediate plate.

Such a structure can be produced by virtue of a hole being initially drilled in the intermediate plate, said hole corresponding to the position of the second connector pad of the lower semiconductor component. The hole can be filled with an insulating material, with a hole with a smaller diameter subsequently being drilled into said insulating material. A coating made of conductive material that is applied in the wall of this smaller hole forms a via in the form of a ring-shaped structure. The ring-shaped structure can be enlarged at its two ends such that an annular ring is formed. The interior of the ring-shaped structure can be sealed with a resin (that is usually nonconductive). Subsequently, the intermediate plate can be coated (plated) over the entire surface thereof with a layer made of electrically conductive material such that the ring-shaped structure is sealed at the relevant end faces. In order to electrically insulate the ring-shaped structure from the intermediate plate, a region surrounding the ring-shaped structure of the plated layer may be removed, for example by means of a lithography method/etching.

It is also possible that a connection area that is connected to the ring-shaped structure fans out from the ring structure without having an electrical contact with the intermediate plate. An electrical contact can be established directly by way of this connection area. Then, it is possible to dispense with filling the ring-shaped structure. However, the annular ring and the connection area must still be exposed by an etching process.

Additionally, or as an alternative to the through hole described above, the intermediate plate can have a thinner material strength in a region that lies opposite the second connector pad of the second semiconductor component than in a region that lies opposite the first connector pad of the second semiconductor component. Then, the first connector pad can lie on the surface of the intermediate plate while the second connector pad is at a distance from the intermediate plate.

The region with a thinner material strength may be embodied as a blind hole. The blind hole forms a depression that is adjacent to the second connector pad, without the intermediate plate being broken through. The blind hole may be completely covered by the second semiconductor component. An interstice between the second connector pad and the blind hole may be filled with an electrically insulating material, for example an insulating resin. The second connector pad may extend through the second semiconductor component. Consequently, the second connector pad can be contacted by the side of the second semiconductor component that lies opposite the intermediate plate.

It is also possible that the region with a thinner material strength extends beyond the boundary of the second semiconductor component. An insulating layer which, for example, may consist of an insulating resin may be arranged between the second connector pad of the second semiconductor component and the intermediate plate. A conductive layer which is electrically conductively connected to the second connector pad may be formed between the insulating layer and the second semiconductor component. As a result, the second connector pad can be contacted from the lower side of the intermediate plate without a conductor having to extend through the lower semiconductor component.

The connection between the connector pads of the semiconductor components and the intermediate plate can be established by an adhesively bonding layer which is electrically conductive and applied between the connector pads and the intermediate plate. Suitable methods are e.g. silver sintering, diffusion soldering, conductive adhesive bonding, soft soldering, etc. The second connector pad of the lower semiconductor component may be connected to a conductor element that is mechanically connected to the intermediate plate but electrically insulated from the intermediate plate. The connection between the second connector pad and the conductor element may be established in a corresponding manner.

After the two semiconductor components have been connected with the intermediate plate, the entirety may be embedded in a layer made of an electrically insulating material, wherein, in addition, it is possible to laminate a copper foil thereon. By way of a suitable method, such as e.g. laser drilling, it is possible to produce channels (microvias) in the insulating material and the copper foil, making selected connector pads accessible through the insulating layer. In particular, these may be connector pads that are arranged on the upper side of the upper semiconductor component and/or on the lower side of the lower semiconductor component. Additionally, or as an alternative thereto, there may be an accessible conductor through the layer, said conductor passing through the plane of the intermediate plate but being electrically insulated from the intermediate plate. By virtue of filling the opening with an electrically conductive material, a connection area, at which e.g. a plug-in contact can be connected, can be produced on the surface of the electrically insulating material. In order to avoid unwanted current flows and short circuits, the printed circuit board element according to the invention may be embedded again in an electrically insulating layer such that only the plug-in contacts are accessible from the outside. The plug-in contacts each form an external pad which also remains accessible in the final state of the printed circuit board element.

The electrically insulating layer may consist of a fiber-reinforced material, in particular of a fiber-reinforced plastic material. The electrically insulating layer may have a supporting function for the printed circuit board element. In particular, the printed circuit board element according to the invention with the intermediate plate and the electrically insulating layer may be self-supporting. A self-supporting printed circuit board element is suitable for use without the printed circuit board element being applied to a substrate.

It is possible for the printed circuit board element, in its final state, to have one or more external pads on both the upper side and the lower side. In order to be able to easily connect the printed circuit board element, it may be advantageous if all external pads are arranged on one side of the electronic component. This may exclude the intermediate plate itself, for example if the printed circuit board element according to the invention is embodied as a half-bridge arrangement and a contact to the phase of the printed circuit board element is established by way of the intermediate plate. In particular, all external pads may be arranged on the upper side of the printed circuit board element.

To this end, there may be a conductor path which extends from the lower side of the lower semiconductor component to the upper side of the printed circuit board element through the plane of the intermediate plate. The conductor path may be electrically insulated from the intermediate plate and/or from other conductor paths which extend from the lower semiconductor component to the upper side of the printed circuit board element. The conductor path may comprise part of the intermediate plate which is electrically insulated from the part of the intermediate plate that is connected to the semiconductor components. It is also possible for the conductor path to comprise one or more vias, which extend from the upper side of the printed circuit board element through the plane of the intermediate plate.

A cooling element may be provided on the upper side and/or lower side of the printed circuit board element. The cooling element may comprise an enlarged surface, for example in the form of cooling fins, by means of which heat can be dissipated from the semiconductor components. In particular, a cooling element may be provided on the lower side of the printed circuit board element if no external pads are provided there. This is the case, in particular, if the external pads are guided to the upper side of the printed circuit board element. The cooling element may have a large area embodiment in the XY-direction such that, in the Z-direction, it completely covers the area that is spanned by the first and/or second semiconductor component. The semiconductor components may be arranged in such a way that they overlap in the Z-direction. The XY-direction corresponds to the plane that is spanned by the intermediate plate; the Z-direction is perpendicular thereto.

The cooling element may be connected to the printed circuit board element by way of a gap-filling layer (thermal interface material, for example in the form of a paste, liquid or flexible film). The thermal interface material may be electrically insulating but have a good thermal conductivity. As a result, this allows the thermal interface material to be in direct contact with conductive parts of the printed circuit board element. At the same time, the thermal interface material may be an adhesively bonding layer, by means of which a mechanical connection is established between the cooling element and the printed circuit board element.

The semiconductor components may be attached to the surface of the intermediate plate in such a way that the semiconductor components project from the surface of the intermediate plate. It is also possible for depressions (cavities) to be formed in the intermediate plate for the purposes of receiving the semiconductor components. The cavities may be dimensioned in such a way that the surface of the semiconductor component lies in the same plane as the surface of the intermediate plate or that the surface of the semiconductor component is even slightly lowered in the intermediate plate. As a result, insulating layers can subsequently be pressed onto the component, without excessive pressure being exerted on the semiconductor components.

The connector pads of the semiconductor components may be directly contacted with the intermediate plate. It is also possible to initially embed the intermediate plate into a layer of electrically insulating material and contact the connector pads through channels (microvias) in the electrically insulating material. The thickness of the insulation varies depending on the voltage class of the application. The material may be glass-fiber reinforced or non-reinforced. The thermal conductivity of the material may lie between e.g. 0.1 W/mK and 20 W/mK, preferably between 0.2 W/mK and 10 W/mK. To this end, the electrically insulating material may initially be coated with a copper foil and then be provided with an electrically conductive layer (plating) in order to contact the connector pads of the semiconductor components with the electrically conductive layer. The semiconductor components may lie on the electrically conductive layer or be received in cavities of the electrically conductive layer. By the application of the electrically insulating layer and a copper foil, it is possible to embody the two contacts of the lower component to be electrically insulated from one another by way of photolithography processes and etching.

The intermediate plate itself may form an external pad of the printed circuit board element. To this end, specific regions of the intermediate plate may be kept free from electrically insulating layers from the outset, said electrically insulating layers being applied in other regions of the intermediate plate. It is also possible to remove such electrically insulating layers again afterwards in order to expose the intermediate plate. Then, an electrical conductor can be connected directly to the intermediate plate, for example by welding, soldering or brazing. In alternative embodiments, in which the intermediate plate is not accessible from the outside, the intermediate plate may be contacted by press-fit contacts. Vias for the press-fit contacts may be formed in the printed circuit board element.

The semiconductor components can be power semiconductors, for example in the form of a MOSFET or an IGBT. The power semiconductors may each comprise three connector pads, of which one is embodied as a drain, one is embodied as a source, and one is embodied as a gate. Source and gate may be arranged on one side of the power semiconductor. The drain connector may be arranged on an opposite side of the power semiconductor. The source connector of the lower power semiconductor may form the first connector pad within the meaning of the invention and may be contacted with the lower side of the intermediate plate. The gate connector of the lower power semiconductor may be the second connector pad within the meaning of the invention which, although it is aligned in the same direction as the source connector, is insulated from the intermediate plate. The gate connector can be contacted by a conductor which is guided through the plane of the intermediate plate to an upper side of the printed circuit board element but which is insulated from the intermediate plate. A gate contact which extends through the power semiconductor (TSV—through silicon via) is also possible. Then, the connection is brought about from the lower side.

The drain connector of the upper power semiconductor may be contacted with the upper side of the intermediate plate. The arrangement of two power semiconductors, in which the source on the one hand and the drain on the other hand are contacted with the intermediate plate, is referred to as a half-bridge arrangement. The intermediate plate forms the phase of this half-bridge arrangement of power semiconductors.

The plane spanned by the intermediate plate is referred to as XY-plane. The semiconductor components may be arranged in such a way that they overlap in the Z-direction that is perpendicular thereto. The overlap may comprise at least 20%, preferably at least 50%, more preferably at least 70%, of the area of the lower semiconductor component.

The semiconductor components may be arranged in such a way that the second connector pad of the lower power semiconductor is exempt from the overlap. As a result, a compact design of the printed circuit board element according to the invention is rendered possible, although the heat output is also concentrated on a small region of the intermediate plate. Particularly if the printed circuit board element has a high heat load, it may therefore also be expedient to arrange the semiconductor components in such a way that they do not overlap in the Z-direction.

The intermediate plate should be dimensioned in such a way that it is able to withstand the currents that occur during the operation of the printed circuit board element. The currents guided by way of the printed circuit board may lie between 10 A and 300 A and, in particular, may be greater than 50 A, preferably greater than 100 A. The assembly area of the intermediate plate that is available for the semiconductor components may be greater than the area spanned by the semiconductor components, in particular by a factor of two, preferably by a factor of three or more. The thickness of the intermediate plate may lie between 0.5 mm and 2.5 mm, preferably between 1 mm and 2 mm.

The electronic component according to the invention in the form of a printed circuit board element may be part of a printed circuit board or form a printed circuit board on its own. The intermediate plate and the electrically insulating layer(s) of the printed circuit board element according to the invention may form a supporting structure of a printed circuit board. By way of example, the printed circuit board may comprise three half-bridges, which are interconnected to form a B6 bridge. It is also possible for the printed circuit board to comprise a half-bridge which is functionally incorporated into the printed circuit board in any other way. The production of the printed circuit board element according to the invention is based on techniques from printed circuit board production, as emerges in detail from the following description.

BRIEF DESCRIPTION OF THE DRAWINGS

Below, the invention is described in an exemplary manner on the basis of advantageous embodiments, with reference being made to the attached drawings. In detail.

DETAILED DESCRIPTION OF THE INVENTION

Figure 1:
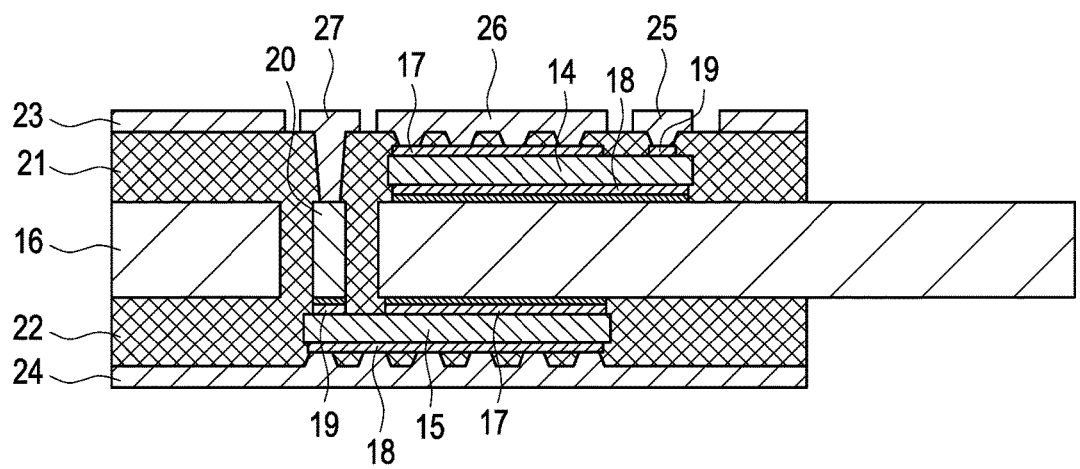
FIG. 1: shows a printed circuit board element according to the invention.
Figure 26:
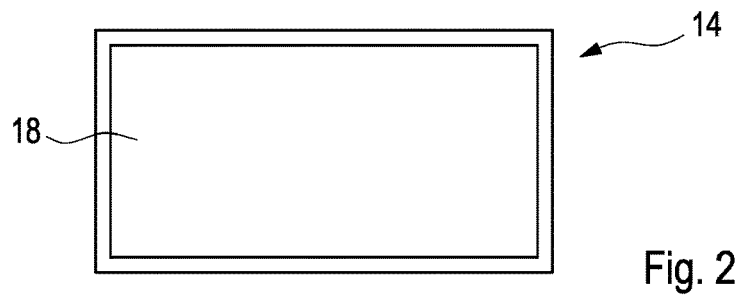
FIG. 26: shows a view from below of a semiconductor component of a printed circuit board element according to the invention.
Figure 27:
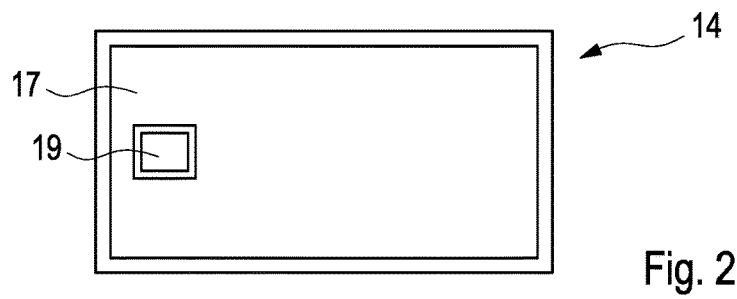
FIG. 27: shows a view from above of the semiconductor component from FIG. 26.

FIG. 1 shows an electronic component as a printed circuit board element in which two semiconductor components in the form of a first power semiconductor 14 and a second power semiconductor 15 are connected from above and below to an intermediate plate 16 (leadframe) in the form of a copper sheet. Each of the power semiconductors 14, 15 comprises a source connector 17, a drain connector 18, and a gate connector 19. In accordance with FIGS. 26 and 27, the source connectors and the drain connectors are embodied over a large area such that they cover a substantial part of the surface of the power semiconductors 14, 15. The gate connector assumes a smaller area. The source connector 17 and the gate connector 19 are respectively arranged together on one side of the power semiconductor 14, 15. The drain connector 18 is situated on the opposite side of the power semiconductor 14, 15.

The Figures in each case only show the functional region according to the invention. Beyond the edges, the printed circuit board element may have further functions. By way of example, three half-bridges may be interconnected to form a B6 bridge or the half-bridge may form a functional element of a printed circuit board.

The power semiconductors 14, 15 are connected to the intermediate plate 16 in a half-bridge arrangement. Thus, there is an electrical contact between the drain connector 18 of the upper power semiconductor 14 and the intermediate plate 16 and an electrical contact between the source connector 17 of the lower power semiconductor 15 and the intermediate plate 16. The phase of this arrangement of power semiconductors 14, 15 is tapped or picked-up directly via the intermediate plate 16, the right-hand portion of which is exposed. As a result of this arrangement, the intermediate plate becomes the phase tap of the half-bridge.

A conductor 20 extends to the upper side of the printed circuit board element from the gate connector 19 of the lower power semiconductor 15. The conductor 20 passes through the intermediate plate 16 but is electrically insulated from the intermediate plate 16.

The arrangement of the two power semiconductors 14, 15 and the intermediate plate 16 is pressed/laminated together with layers 21, 22 made of a nonconductive material above and below, respectively. Electrically conductive layers 23, 24 are applied to the layers 21, 22 in turn, said electrically conductive layers being connected to the connector pads of the power semiconductors 14, 15 through channels formed in the layers 21, 22. The electrically conductive layers 23, 24 are subdivided into regions that are electrically separated from one another such that there is no short circuit between the various connector pads of the power semiconductors 14, 15.

In FIG. 1, a first external pad 25 is connected to the gate connector 19 of the upper power semiconductor 14 by way of a channel that extends through the nonconductive layer 21. A second external pad 26 is connected to the source connector 17 of the upper power semiconductor 14. A third external pad 27 is electrically connected to the gate connector 19 of the lower power semiconductor 15 via the conductor 20. The lower electrically conductive layer 24 is connected to the drain connector 18 of the lower power semiconductor 15.

Figure 2:
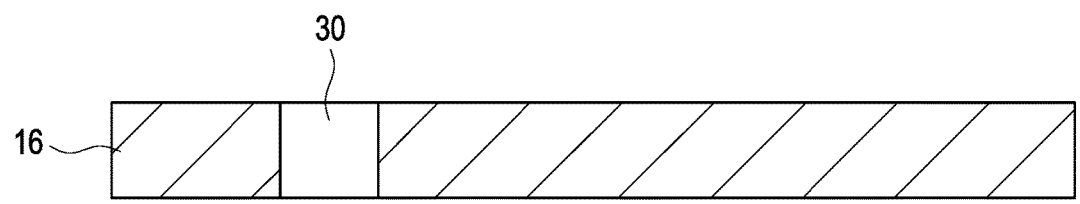
FIGS. 2 to 10: show method steps during the production of a component in accordance with FIG. 1.
Figure 3:
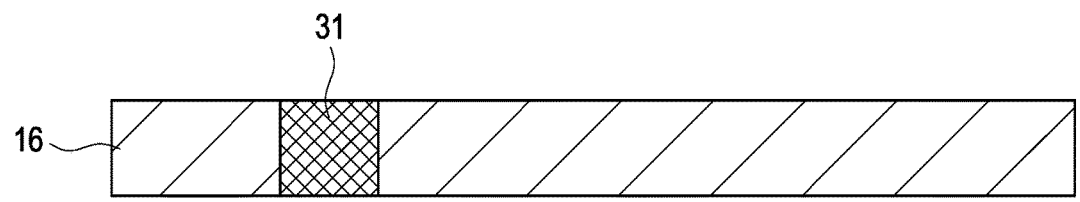
Figure 4:
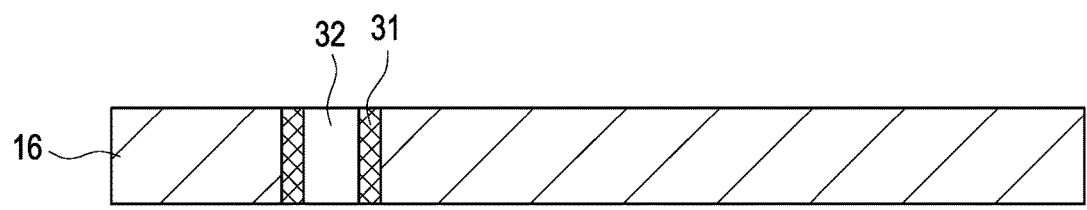
Figure 5:
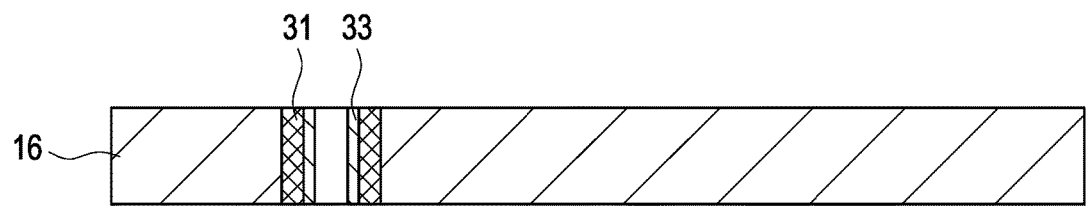
Figure 6:
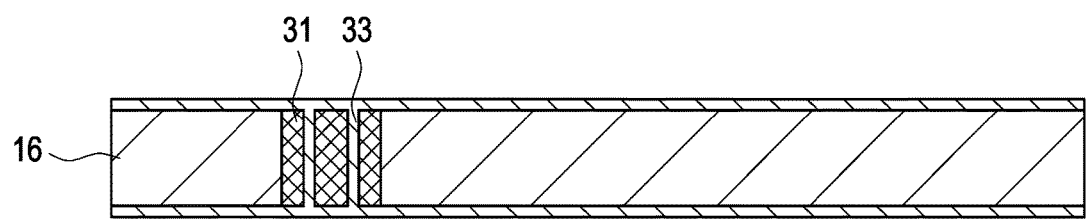
Figure 7:
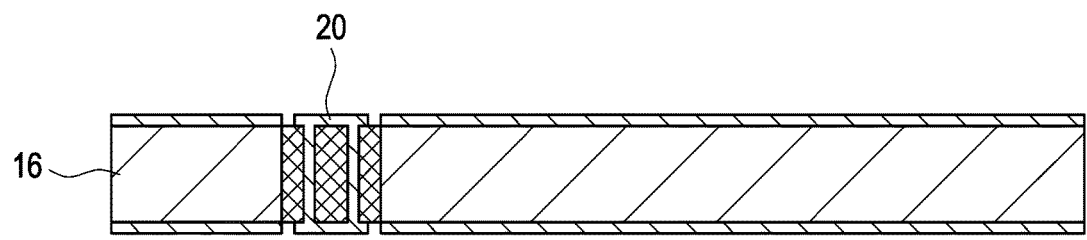

In order to produce such a printed circuit board element, a drill hole 30 is produced in the intermediate plate 16 in a first step (FIG. 2). The drill hole 30 is sealed with a plug 31 made of an insulating resin (FIG. 3) and a further drill hole 32 is produced in the plug 31 (FIG. 4). A through contact or through-hole plating 33 is produced in the drill hole 32 (FIG. 5), said through-hole plating 33 covering the hole wall of the drill hole 32. The interior of the through-hole plating 33 is sealed with a plug made of an insulating material. After applying an electrically conductive layer, it is possible to plate the surface (FIG. 6). The region of the through-hole plating 33 is electrically insulated from the intermediate plate 16 by etching (FIG. 7) such that a conductor 20 passing through the plane of the intermediate plate 16 results.

Figure 8:
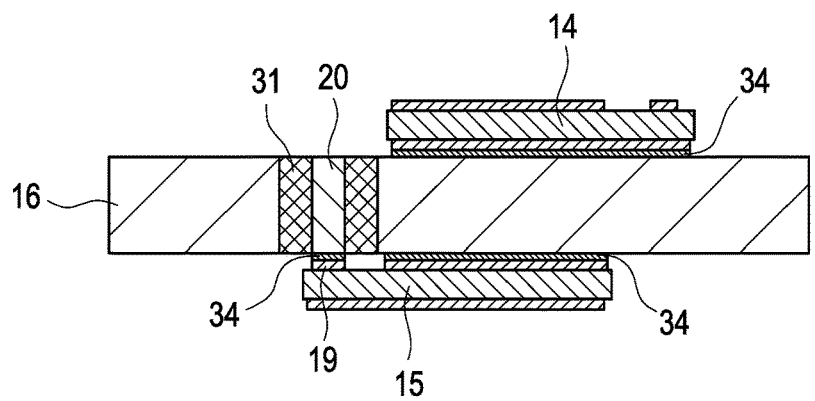

The power semiconductors 14, 15 can be connected to the intermediate plate 16 that is prepared in this way (FIG. 8). To this end, an electrically conductive, adhesively bonding layer 34 is applied between the intermediate plate 16 and the respective connector pads of the power semiconductors 14, 15. The power semiconductors 14, 15 are connected both electrically and mechanically to the intermediate plate 16 by way of the layer 34. The gate connector 19 of the lower power semiconductor 15 is connected to the conductor 20 in the same way.

Figure 9:
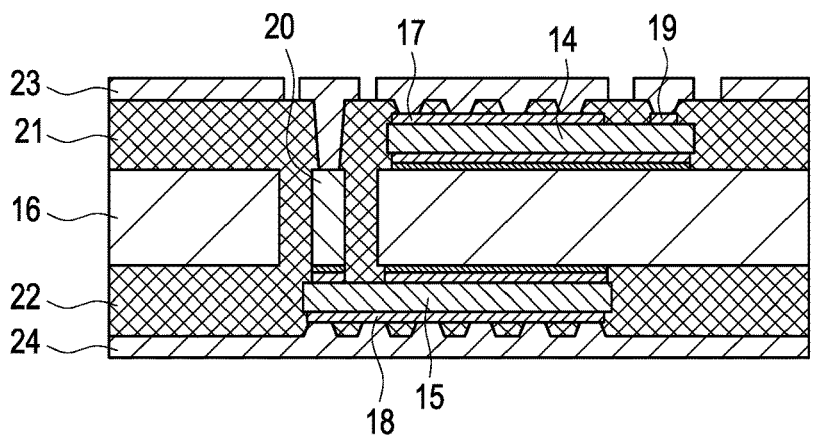

The power semiconductors 14, 15 are laminated into layers 21, 22 made of insulating material. In the case of an assembly without cavities, parts or sections of the layer 21, 22 may be exposed for receiving the components. In the layers 21, 22, channels are formed which make the connector pads of the power semiconductors 14, 15 accessible. Four channels which extend to the source connector 17 of the upper power semiconductor 14 can be seen in the sectional illustration of FIG. 9. One channel extends to the gate connector 19 of the upper power semiconductor 14. One channel extends to the gate connector 19 of the upper semiconductor 14. One channel extends to the conductor 20. A plurality of channels extend through the lower insulating layer 22 to the drain connector 18 of the lower power semiconductor 15. By means of plating, the electrically conductive layers 23, 24 are enhanced such that these also fill the channels and thus contact the connector pads of the power semiconductors 14, 15.

Figure 10:
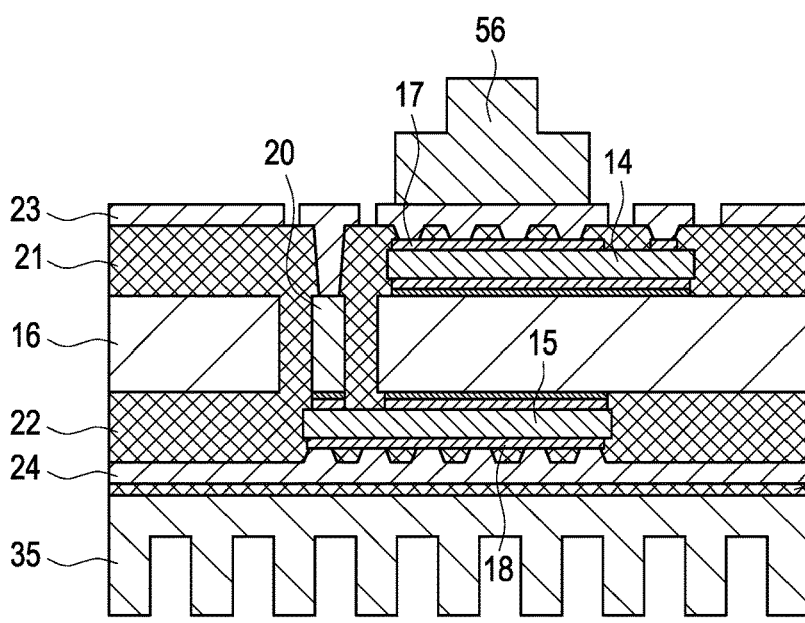

In accordance with FIG. 10, a cooling body 35 which extends over a large area is applied to the lower electrically conductive layer 24. The cooling body 35 is connected to the electrically conductive layer 24 by way of an intermediate ply 36. The intermediate ply 36 has an electrically insulating effect, but good thermal conductivity. A plug-in connector 56, which simultaneously acts as a cooling element, is connected to the source connector 17 of the upper power semiconductor 14. The drain connector 18 of the lower power semiconductor 15 is contacted directly by the electrically conductive layer 24 (outside of the presented region).

Figure 11:
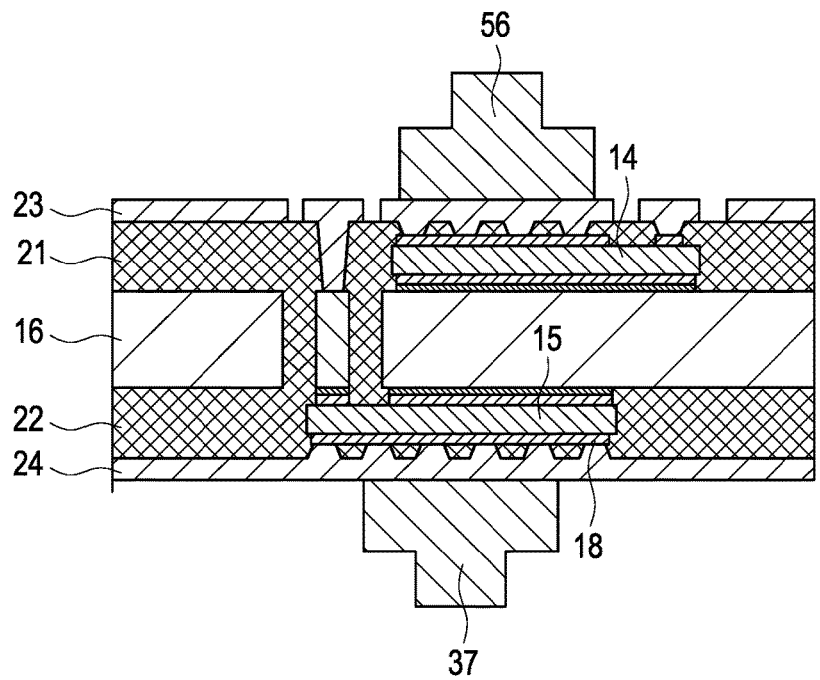
FIGS. 11 to 25: show schematic illustrations of alternative embodiments of electronic components according to the invention.

In the alternative embodiment in accordance with FIG. 11, a second plug-in connector 37, which simultaneously acts as a cooling element, is connected instead of the cooling body 35. The drain connector 18 of the lower power semiconductor 15 can be addressed via the plug-in connector 37.

Figure 12:
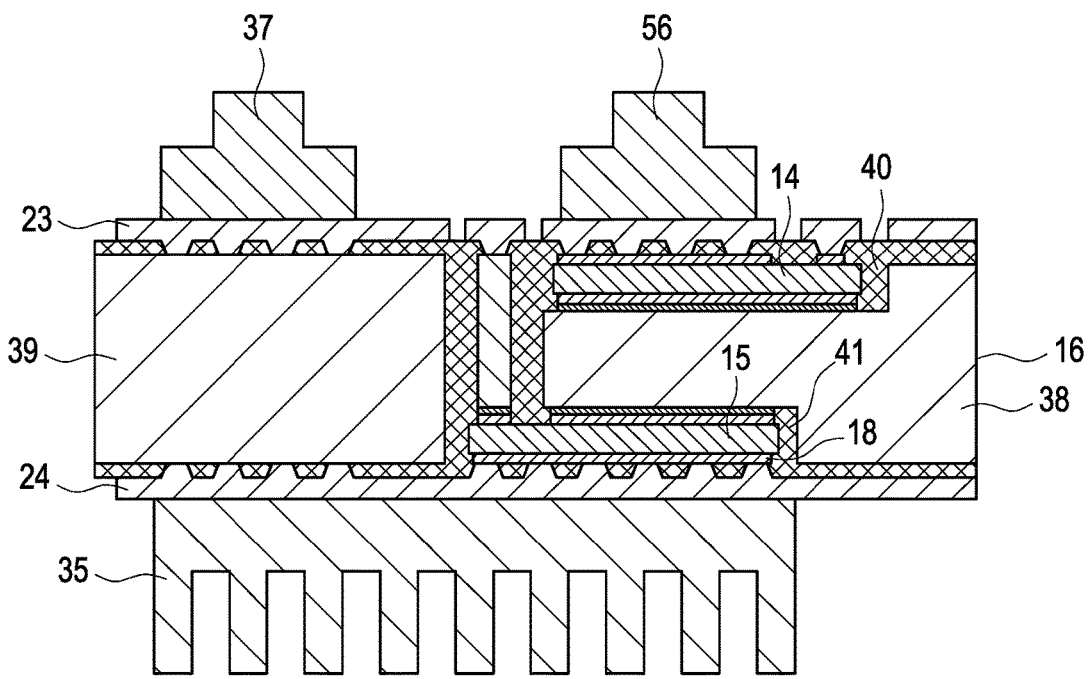
Figure 13:
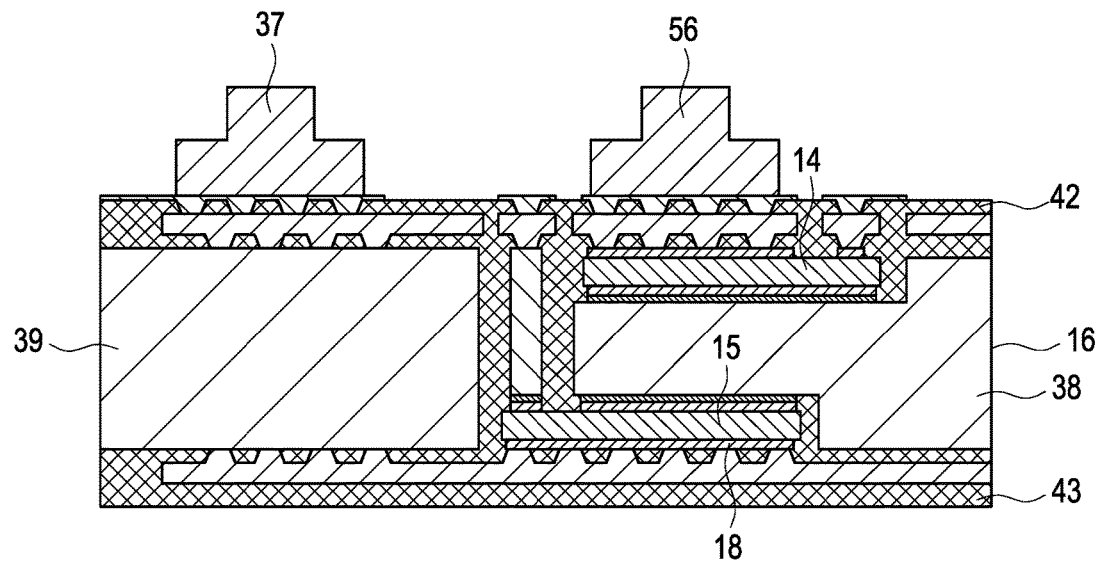

FIG. 12 presents a further variant in which a first portion 38 and a second portion 39 of the intermediate plate 16 are electrically insulated from one another. The portion 38 forms the phase to which the drain connector 18 of the upper power semiconductor 14 and the source connector 17 of the lower power semiconductor 15 are connected. An electrical contact between the drain connector 18 of the lower power semiconductor 15 and the upper side of the printed circuit board element is established by way of the portion 39. A plug-in connector 37 acts as a cooling element on one hand and as a connector to the drain pad 18 of the lower power semiconductor 15 on the other. Moreover, the power semiconductors 14, 15 are received in cavities 40, 41 of the portion 38 of the intermediate plate 16. In order to avoid unwanted contacts of the electrically conductive layers 23, 24 to the outside, it is possible to apply layers 42, 43 made of an electrically insulating material (FIG. 13).

Instead of two electrically insulated portions 38, 39 of the intermediate plate 16, it is also possible to produce a large-area break in the intermediate plate 16, said break being filled with an electrically insulating material 44 and also having a plurality of vias 45 produced therein. In this way too, it is possible to establish an electrical contact between the drain connector 18 of the lower power semiconductor 15 and the plug-in connector 37 on the upper side of the printed circuit board element.

Figure 14:
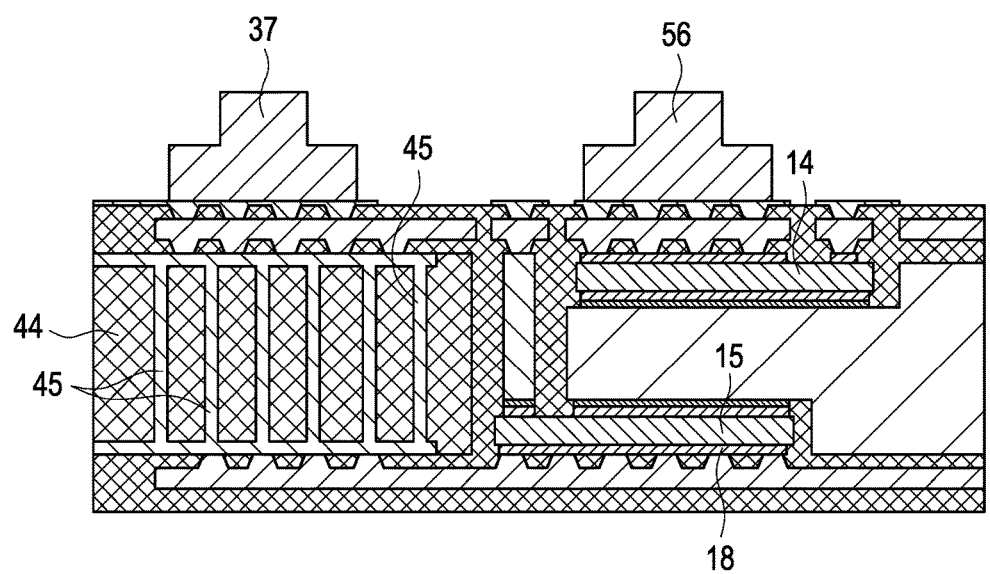
Figure 15:
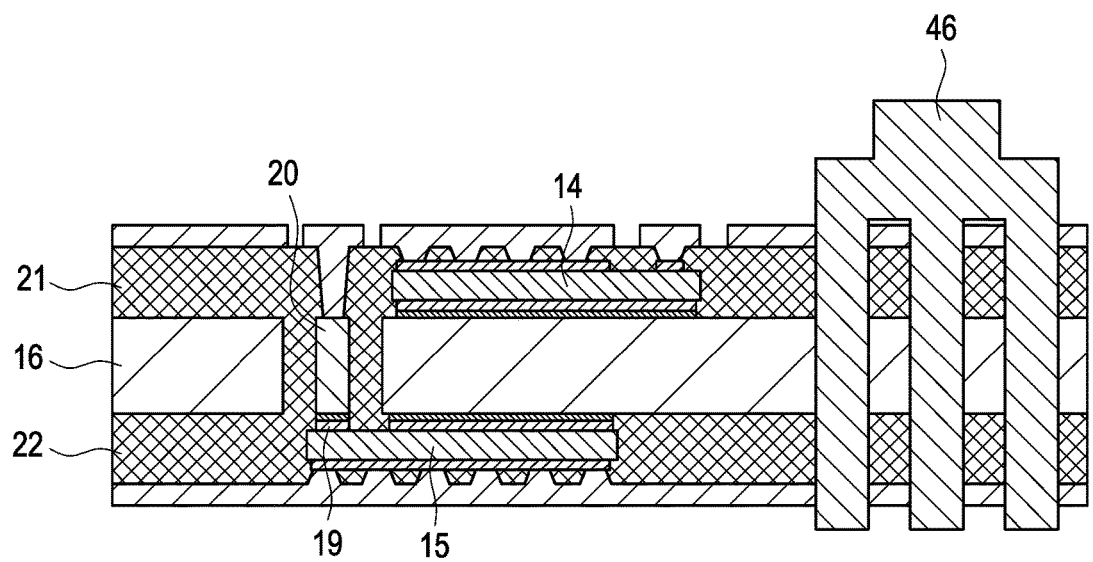

FIG. 14 presents an embodiment in which the phase connected to the drain connector 18 of the upper power semiconductor 14 and to the source connector 17 of the lower power semiconductor 15 can be tapped or picked-up directly from the intermediate plate 16. If the intermediate plate 16 in the alternative embodiment in accordance with FIG. 15 is pressed into layers 21, 22 made of electrically insulating material, tapping of the phase can also be effectuated through a press-fit contact 46, which is pressed into vias which pass through the intermediate plate 16.

Figure 16:
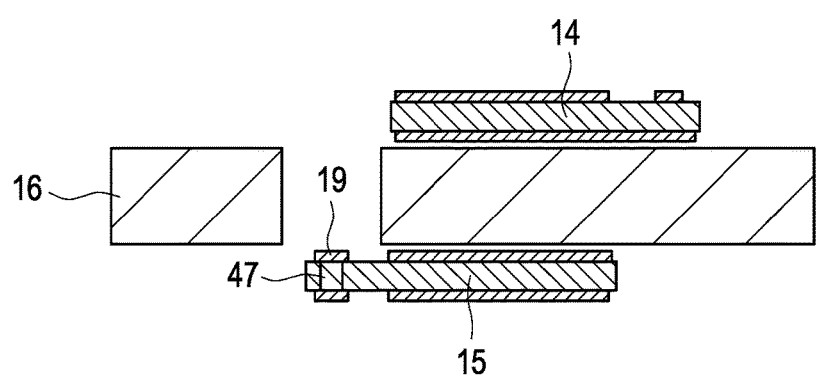
Figure 17:
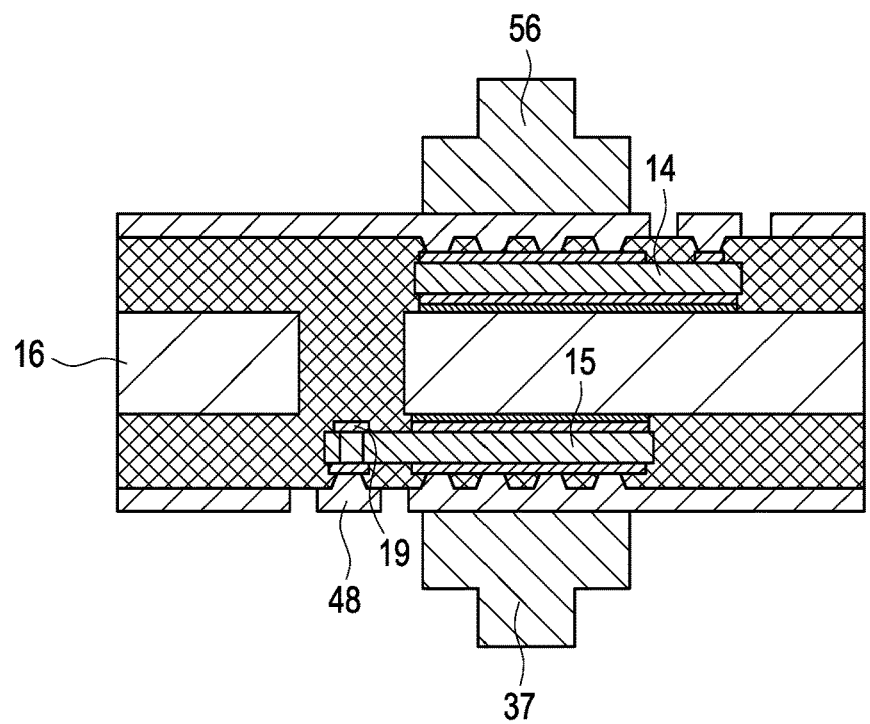
Figure 18:
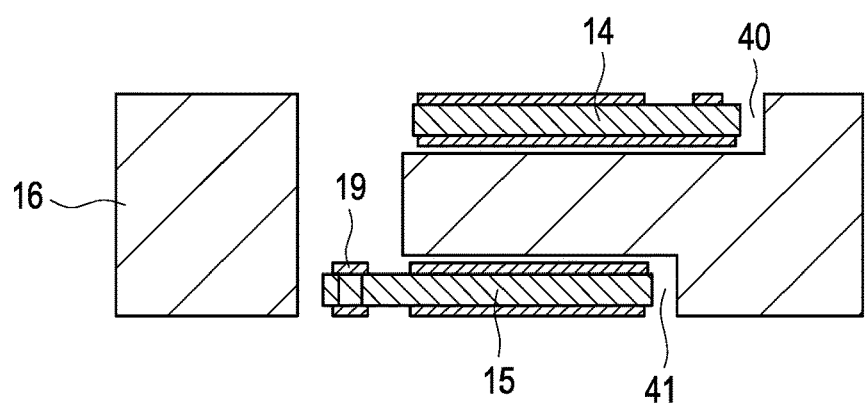
Figure 19:
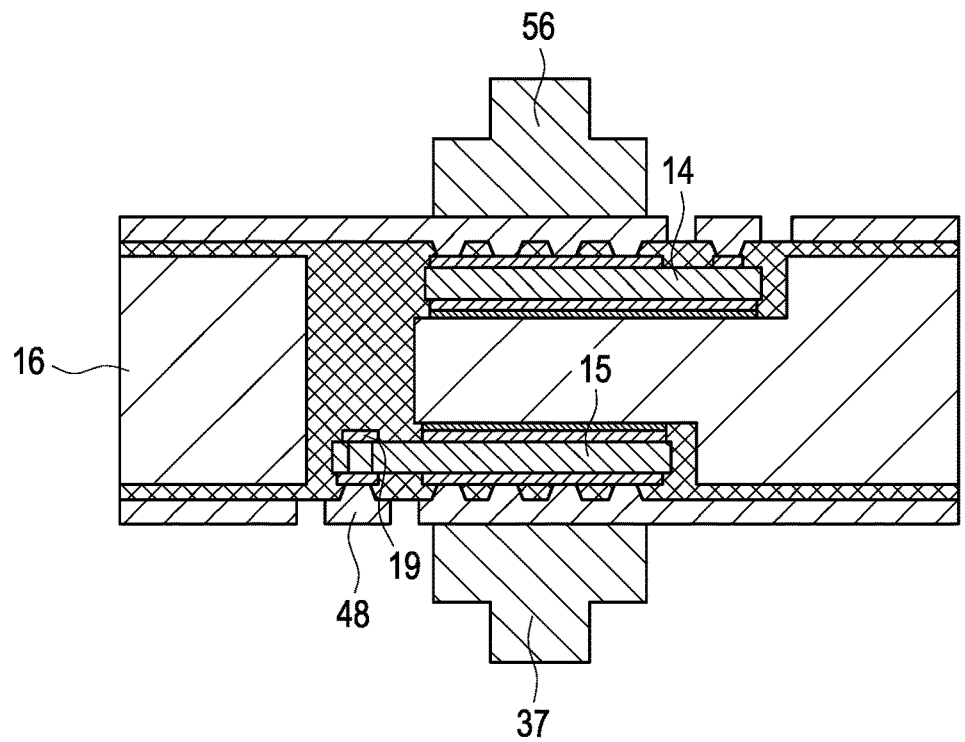

Instead of contacting the gate connector 19 of the lower power semiconductor 15 with a conductor 20 from the upper side of the printed circuit board element, of a conductor 47 can be provided in accordance with FIG. 16 which conductor is guided through the power semiconductor 15 to the lower side of the power semiconductor 15 (TSV—through silicon via). This allows the gate connector 19 of the lower power semiconductor 15 to be contacted from the lower side of the printed circuit board element; see the connector 48 in FIG. 17. FIGS. 18 and 19 show a corresponding variant, in which the power semiconductors 14, 15 are received in cavities 40, 41 of the intermediate plate 16.

Figure 20:
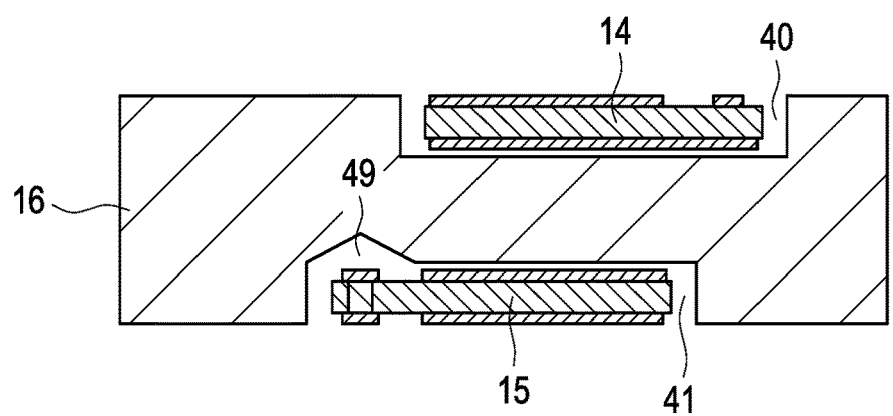

It is possible for the intermediate plate 16 to have a break above the gate connector 19 of the lower power semiconductor 15 (see FIGS. 16 to 19) in order to avoid a short circuit between the gate connector 19 and the intermediate plate 16. Alternatively, a recess 49 designed as a blind hole may be formed in the intermediate plate 16 in accordance with FIG. 20. The cavity arising as a result thereof is filled with laminating resin during the pressing.

Figure 21:
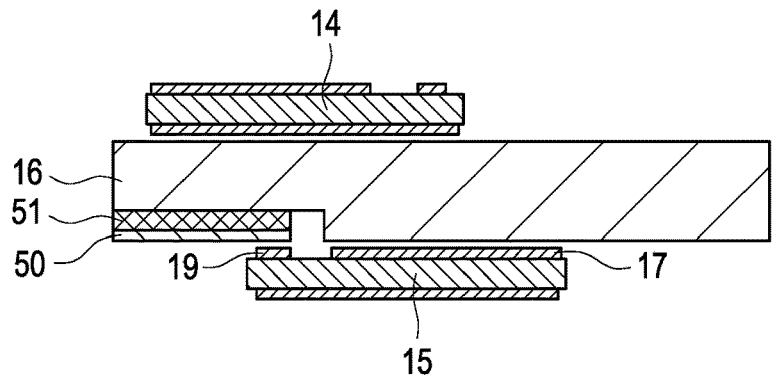
Figure 22:
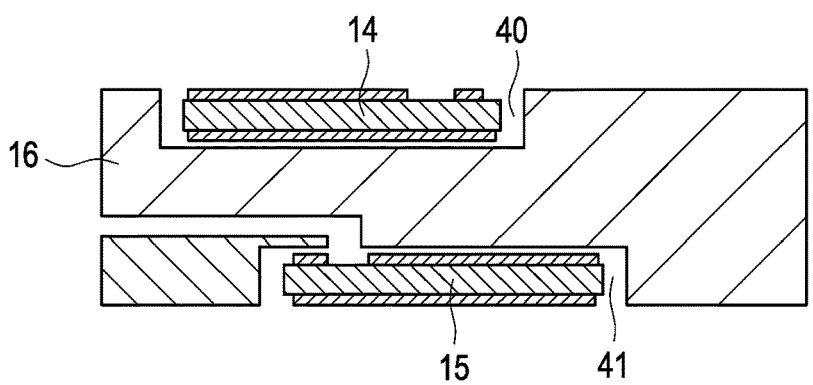

FIG. 21 shows an embodiment in which a region of the intermediate plate 16 lying opposite the gate connector 19 of the lower power semiconductor 15 is recessed relative to a region that lies opposite the source connector 17 of the lower power semiconductor 15. As a result, the source connector 17 can be contacted with the intermediate plate 16 while the gate connector 19 is spaced apart such that there is no electrical contact. The gate connector 19 may be contacted by way of an electrically conductive layer 50 which, in turn, is separated from the intermediate plate 16 by way of an electrically insulating layer 51. The according step or notch in the intermediate plate 16 may be produced either in an additive manner by plating or in a subtractive manner by etching. The region with a thinner material strength can then be coated with a layer made of insulating material and a copper foil. The electrically conductive layer can be strengthened/enhanced in the desired region by electroplating. FIG. 22 shows an associated variant, in which the power semiconductors 14, 15 are received in cavities 40, 41 of the intermediate plate 16 after laminating.

Figure 23:
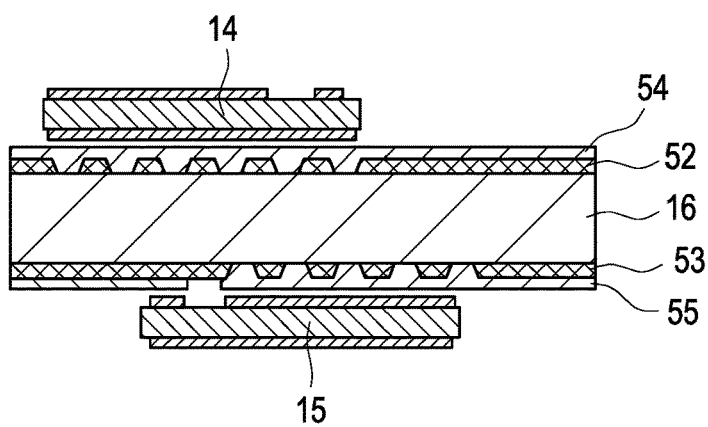
Figure 24:
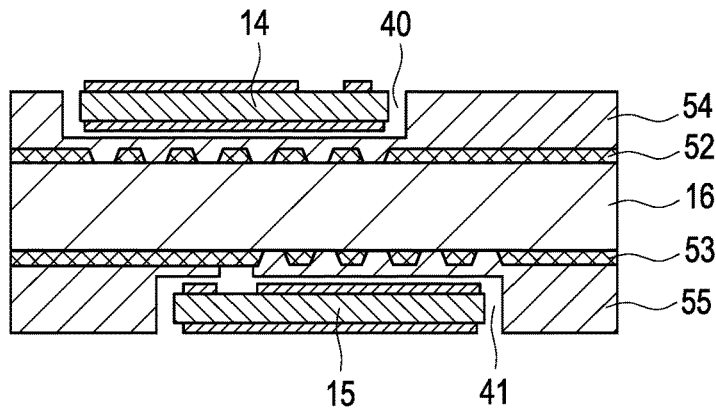
Figure 25:
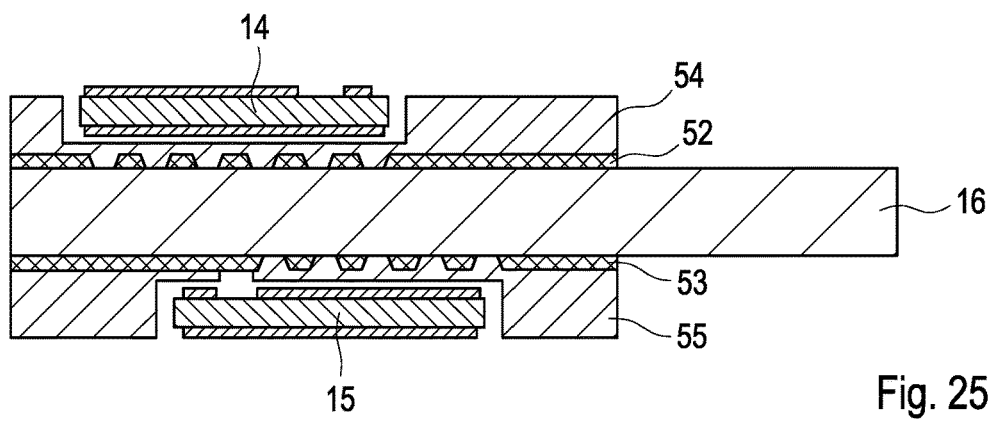

In the alternative embodiment in accordance with FIG. 23, the intermediate plate 16 is directly pressed with insulating layers 52, 53 and associated copper foils. The electrical contact between the power semiconductors 14, 15 and the intermediate plate 16 is produced by channels (microvias) in the layers 52, 53, which are filled with an electrically conductive material and which are contacted with electrically conductive layers 54, 55. In the case of the layers 54, 55, it is alternatively also possible to sink the power semiconductors 14, 15 into cavities 40, 41 (FIG. 24). A portion of the intermediate plate 16 that is distant from the power semiconductors 14, 15 may be excluded from the insulating coatings 52, 53 in order to facilitate an electrical access to the phase.

The invention claimed is:

1. A printed circuit board element comprising:
a first semiconductor component which is arranged on an upper side of an electrically conductive intermediate plate such that a connector pad of the first semiconductor component has a whole-area electrical contact with the intermediate plate;
a second semiconductor component which is arranged on a lower side of the intermediate plate;
the second semiconductor component comprises a first connector pad and a second connector pad;
the first and second connector pads are aligned in a direction of the intermediate plate; and
the first connector pad is contacted with the intermediate plate, the second connector pad is not contacted with the intermediate plate, and the intermediate plate forms a phase tap of the printed circuit board element.

2. The printed circuit board element as claimed in claim 1, wherein the intermediate plate comprises a recess for avoiding electrical contact between the intermediate plate and the second connector pad of the second semiconductor component.

3. The printed circuit board element as claimed in claim 2, wherein the recess has the form of a through hole which extends through the intermediate plate.

4. The printed circuit board element as claimed in claim 3, wherein an electrical conductor extends through the through hole.

5. The printed circuit board element as claimed in claim 4, wherein the conductor has a ring-shaped embodiment in the plane of the intermediate plate.

6. The printed circuit board element as claimed in claim 1, wherein the intermediate plate has a thinner material strength in a region that lies opposite the second connector pad of the second semiconductor component than in a region that lies opposite the first connector pad of the second semiconductor component.

7. The printed circuit board element as claimed in claim 1, wherein the second connector pad of the second semiconductor component is contacted from the upper side of the intermediate plate.

8. The printed circuit board element as claimed in claim 1, wherein the second connector pad of the second semiconductor component extends through the second semiconductor component.

9. The printed circuit board element as claimed in claim 1, wherein the first semiconductor component and/or the second semiconductor component is/are embedded in a layer made of an electrically insulating material and wherein a connector pad of the semiconductor component is contacted through a channel in the layer.

10. The printed circuit board element as claimed in claim 1, wherein all external pads are arranged on the upper side of the intermediate plate.

11. The printed circuit board element as claimed in claim 1, wherein the intermediate plate is embedded in a layer made of an electrically insulating material and wherein the connector pads of the semiconductor components are contacted with the intermediate plate through channels in the layer.

12. The printed circuit board element as claimed in claim 1, wherein the electrically insulating layer is formed from a fiber-reinforced material and/or wherein the electrically insulating layer has a supporting function for the printed circuit board element.

13. The printed circuit board element as claimed in claim 1, wherein the connector pad of the first semiconductor component is a drain connector of a first power semiconductor, wherein the first connector pad of the second semiconductor component is a source connector of a second power semiconductor, and wherein the second connector pad of the second semiconductor component is the gate connector of the second power semiconductor.

14. A printed circuit board, comprising a printed circuit board element as claimed in claim 1.

15. A method for producing a printed circuit board element, comprising:
arranging a first semiconductor component on an upper side of an electrically conductive intermediate plate such that a connector pad of the semiconductor component has a whole-area electrical contact with the intermediate plate;
arranging a second semiconductor component on a lower side of the intermediate plate, wherein the second semiconductor component comprises a first connector pad and a second connector pad;
aligning the first and second connector pads in a direction of the intermediate plate;
contacting the first connector pad with the intermediate plate, wherein the second connector pad is not contacted with the intermediate plate, and wherein the intermediate plate forms a phase tap of the printed circuit board element.

16. The method as claimed in claim 15, wherein a first hole is produced in the intermediate plate before the attachment of the semiconductor component, a position of the first hole corresponding to the second connector pad of the lower semiconductor component.

17. The method as claimed in claim 16, wherein the first hole is filled with an insulating material, a second hole with a smaller diameter subsequently being drilled into the insulating material.

18. The method as claimed in claim 17, wherein the wall of the second hole is coated with a layer made of a conductive material such that a ring-shaped structure arises.

19. The method as claimed in claim 18, wherein a layer is applied, by means of which an end face of the ring-shaped structure is closed.

20. The method as claimed in claim 19, wherein the ring-shaped structure is electrically insulated from the surroundings.

21. The method as claimed in claim 15, wherein a region with a thinner material strength is produced in the intermediate plate before the attachment of the semiconductor component, the region of thinner material strength corresponding to the position of the second connector pad of the lower semiconductor component.

22. The method as claimed in claim 21, wherein the region with a thinner material strength is embodied as a blind hole.

23. The method as claimed in claim 21, wherein the region with a thinner material strength extends beyond the second semiconductor component.

24. The method as claimed in claim 15, wherein the intermediate plate is initially embedded in a layer made of electrically insulating material before the attachment of the semiconductor component and the connector pads are contacted through channels in the electrically insulating material.

\* \* \* \* \*